United States Patent
Switzer

(10) Patent No.: US 10,998,354 B2
(45) Date of Patent: May 4, 2021

(54) MULTI-JUNCTION DETECTOR DEVICE AND METHOD OF MANUFACTURE

(71) Applicant: Newport Corporation, Irvine, CA (US)

(72) Inventor: Greggory W Switzer, Bozeman, MT (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 16/553,921

(22) Filed: Aug. 28, 2019

(65) Prior Publication Data

US 2019/0386043 A1 Dec. 19, 2019

Related U.S. Application Data

(63) Continuation of application No. 15/661,892, filed on Jul. 27, 2017, now Pat. No. 10,411,050.
(Continued)

(51) Int. Cl.
*H01L 27/144* (2006.01)
*H01L 31/0203* (2014.01)
(Continued)

(52) U.S. Cl.
CPC ...... *H01L 27/1443* (2013.01); *H01L 31/0203* (2013.01); *H01L 31/028* (2013.01); *H01L 31/02327* (2013.01)

(58) Field of Classification Search
CPC ...... G01J 1/0214; G01J 1/0271; G01J 1/4228; G01J 1/029; G01J 1/0403; G01J 1/0488;
(Continued)

(56) References Cited

U.S. PATENT DOCUMENTS

| 4,498,012 A * | 2/1985 | Duda | G01J 1/4228 250/208.2 |
|---|---|---|---|
| 5,631,460 A | 5/1997 | Gray | |

(Continued)

FOREIGN PATENT DOCUMENTS

| WO | 2014035389 A1 | 3/2014 |
|---|---|---|
| WO | 2018026634 A1 | 2/2018 |

OTHER PUBLICATIONS

G.P. Eppeldauer, et. al.: Optomechanical and electronic design of a tunnel-trap Si radiometer, National Institute of Standards and Technology. Journal of Research, vol. 105, No. 6, Nov. 1, 2000, pp. 813-828.
(Continued)

*Primary Examiner* — Michael C Bryant

(57) ABSTRACT

A novel multi-junction detector device and method of manufacture is disclosed, which includes providing a housing, at least one system mount body positioned within the housing, forming at least one beam dump region in the system mount body in optical communication with at least one first detector having a first wavelength responsivity range positioned on the system mount body and at least one second detector having a second wavelength responsivity range positioned on the system mount body in optical communication with the first detector. An arcuate shape, an arcuate shape of varying radius, a polygonal shape or a polyhedral shape may be formed on at least one mount body wall in the beam dump region. The method may also comprise depositing at least one reflectivity enhancing material onto the mount body wall. The method may further comprise depositing an energy dissipating material on the mount body wall.

16 Claims, 17 Drawing Sheets

Related U.S. Application Data

(60) Provisional application No. 62/370,204, filed on Aug. 2, 2016.

(51) Int. Cl.
*H01L 31/0232* (2014.01)
*H01L 31/028* (2006.01)

(58) Field of Classification Search
CPC ............. H01L 27/1443; H01L 31/0203; H01L 31/02327; H01L 31/028; H01L 31/03046; H01L 31/03048; H01L 31/032; H01L 31/111
See application file for complete search history.

(56) References Cited

U.S. PATENT DOCUMENTS

| | | | |
|---|---|---|---|
| 6,246,045 B1 * | 6/2001 | Morris | G01J 1/04 |
| | | | 250/216 |
| 6,252,719 B1 | 6/2001 | Eichenbaum | |
| 6,810,161 B2 | 10/2004 | Flower | |
| 8,736,825 B2 | 5/2014 | Ciocan | |
| 2012/0287353 A1 | 11/2012 | Tajiri | |
| 2013/0044977 A1 | 2/2013 | Amit | |
| 2014/0021335 A1 | 1/2014 | Ciocan | |

OTHER PUBLICATIONS

Supplementary European Search Report, EP application 17837434, dated Feb. 28, 2020.
Written Opinion of the International Search Authority, application PCT/US2017/044262, dated Nov. 11, 2017.

* cited by examiner

MULTI-JUNCTION DETECTOR DEVICE AND METHOD OF MANUFACTURE

CROSS-REFERENCE TO RELATED APPLICATIONS

The present application claims priority to U.S. Provisional Patent Application Ser. No. 62/370,204—entitled "Multi-Junction Detector Device and Method of Use," filed on Aug. 2, 2016, and U.S. patent application Ser. No. 15/661,892— entitled "Multi-Junction Detector Device and Method of Use," filed on Jul. 27, 2017, the entire contents both of which are incorporated by reference in their entirety herein.

BACKGROUND

Photodiodes are the most commonly used photodetectors in use today. Presently, they are used in any variety of applications and are rapidly being incorporated into numerous additional applications. Generally, photodiodes offer a compact, rugged, low cost alternative to photomultipliers or similar devices.

Currently, photodiodes are manufactured from a number of materials, each material offering sensitivity within a defined range of the electromagnetic spectrum. For example, as shown in FIG. 1, Silicon-based photodiodes and photodetectors typically produce significant photocurrents when irradiated with a signal having a wavelength from about 180 nm to about 1100 nm. In contrast, as shown in FIG. 2, Germanium-based photodiodes produce significant photocurrents when irradiated with a signal having a wavelength from about 800 nm to about 1800 nm.

Presently, various applications utilize both Silicon-based photodiodes and Germanium-based photodiodes to measure optical signals having broad spectral characteristics (e.g. from about 180 nm to about 1800 nm). As shown in FIGS. 3-5, multiple approaches have been utilized in the past to construct a device or system which incorporates both Silicon-based photodiodes and Germanium-based photodiodes. For example, as shown in FIG. 3, prior art systems included a split light approach which included a wavelength-dependent mirror or filter to separate the incident light at a desired wavelength. While this approach proved somewhat useful in the past, a number of shortcomings have been identified. For example, as shown in FIG. 4, a pronounced wavelength dependent responsivity gap is present at the point at which the mirror transitions from absorbing to transmitting an incident broad spectrum light.

In response, as shown in FIG. 5, an alternate prior art approach was developed which utilized a multiple layer or sandwich detector, wherein the photodiode comprises a Silicon-based detector applied to the body of a Germanium-based detector. Again, as shown in FIG. 6, a pronounced wavelength dependent responsivity gap is present at the point at which the Silicon-based detector transitions from absorbing to transmitting an incident broad spectrum light using a sandwich detector approach.

Further, the responsivity of these devices varies depending on the wavelength of the incident signal. For example, while Silicon-based photodetectors are capable of detecting signals having a wavelength from about 180 nm to 1100 nm, the highest responsivity is from about 850 nm to about 1000 nm. As such, the measurement of broad spectral ranges typically requires multiple photodetectors each manufactured using photodiodes manufactured from different materials. As such, systems incorporating multiple photodetectors manufactured from various materials may be large and unnecessarily complex.

Thus, there is an ongoing need for a multi-junction detector device capable of detecting an incident signal with high responsivity at a variety of wavelengths with very few if any spectral gaps or discontinuities, thereby offering smooth, continuous spectral measurements.

SUMMARY

The present application is directed to a novel multi-junction detector device and method of manufacture or use. In one embodiment, the present application discloses a method of manufacture by providing at least one housing with at least one system mount body positioned therein. At least one first detector with a first wavelength responsivity range may be mounted to the system mount body and at least one second detector with a second wavelength responsivity range may be mounted to a second detector mount body. At least one beam dump region with at least one mount body wall may be formed within the system mount body such that the beam dump region is positioned in optical communication with the first detector and the second detector. The first detector and/or the second detector may also be a detector array. An additional detector with a third wavelength responsivity range may also be mounted on the system mount body or the second the second detector mount body. The system mount body and the second detector mount body may be formed as a monolithic body. The mount body wall formed in the beam dump region may be formed with an arcuate shape, an arcuate shape with varying radius, a polygonal shape or a polyhedral shape. The method of manufacture may also comprise forming a heat dissipating feature on the mount body wall of the beam dump region or the system mount body or the second detector mount body. A reflectivity enhancing material may be deposited on the mount body wall of the beam dump region. An energy dissipating material configured to reduce or prevent unwanted reflected energy from propagating to the first detector or the second detector may be deposited on the mount body wall of the beam dump region. A processor device may be provided, the processor device being in communication with the first and second detectors via at least one conduit.

In another embodiment, the present application discloses a multi-junction detector device having at least one housing. At least one mount system body may be positioned within the housing. At least one beam dump region may be formed in the mount system body. A first detector having a first wavelength responsivity range may be positioned on the mount system body. Further, at least a second detector having at least a second wavelength responsivity range may be positioned on the mount system body in optical communication with the first detector. During use, the first detector may be configured to absorb a portion of an incident optical signal within the first wavelength responsivity range and the second detector may be configured to absorb a portion of an incident optical signal within the second wavelength responsivity range and reflect at least a portion of the optical signal to the beam dump region.

In another embodiment, the multi-junction detector may include at least one mount system body. At least a first detector having a first wavelength responsivity range may be positioned on the mount system body. The first detector may be configured to absorb light of a first spectral range of an incident optical signal and to reflect unabsorbed light to at least a second detector coupled to or positioned proximate to the mount system body. The second detector has at least a second wavelength responsivity range and is in optical communication with the first detector. The second detector may be configured to absorb light within a second spectral range and reflect an unabsorbed portion of the optical signal to at least one beam dump region in optical communication with the second detector.

In another embodiment, the present application is directed to a multi-junction detector device. The multi-junction detector device may include at least one housing configured to house and securely position at least one integrating sphere therein. In one embodiment, at least one detector device may be positioned within the integrating sphere. For example, a first detector having a first wavelength responsivity range and configured to absorb light from an incident optical signal and generating a first responsivity signal, at least a second detector having at least a second wavelength responsivity range and configured to absorb light and generating a second responsivity signal may be positioned within or proximate to at least one integrating sphere. Further, at least one electrical circuit may be in communication with at least one of the first and second detectors and configured to receive at least the first and second responsivity signals from at least the first and second detectors. In addition, the multi-junction detector device may include at least one processor device configured in electrical communication with the at least one electrical circuit and configured to receive and combine at least the first and second responsivity signals into an extended range signal, wherein the extended-range signal exhibits a substantially linear spectral response over an extended range of wavelengths.

Other features and advantages of the embodiments of the novel multi-junction detector device as disclosed herein will become apparent from a consideration of the following detailed description.

BRIEF DESCRIPTION OF THE DRAWINGS

Various embodiments of the multi-junction detector device will be explained in more detail by way of the accompanying drawings, wherein.

DETAILED DESCRIPTION

The present application is directed to several embodiments of a multi-junction detector device. In some embodiments, the multi-junction detector device includes a first detector and at least a second detector therein, although those skilled in the art will appreciate that any number and type of detector devices may be used with the multi-junction detector device. Further, in some embodiments, the first detector device may have a first spectral responsivity range while the second detector device may have a second spectral responsivity range. Optionally, the first and second spectral responsivity ranges may be the same or different.

Figure 1:
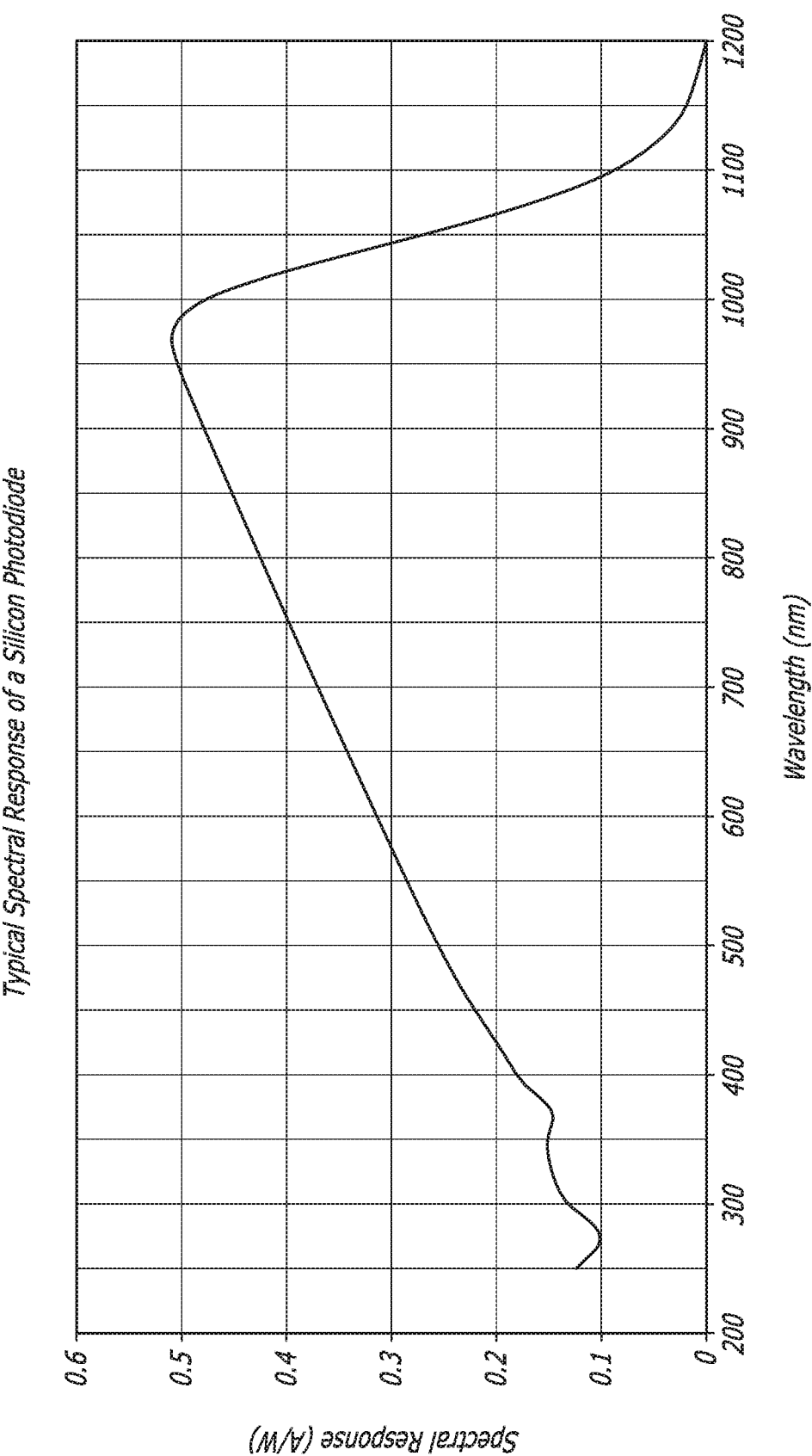
FIG. 1 shows a graph of the spectral response of a typical Silicon photodiode as known in the prior art.
Figure 2:
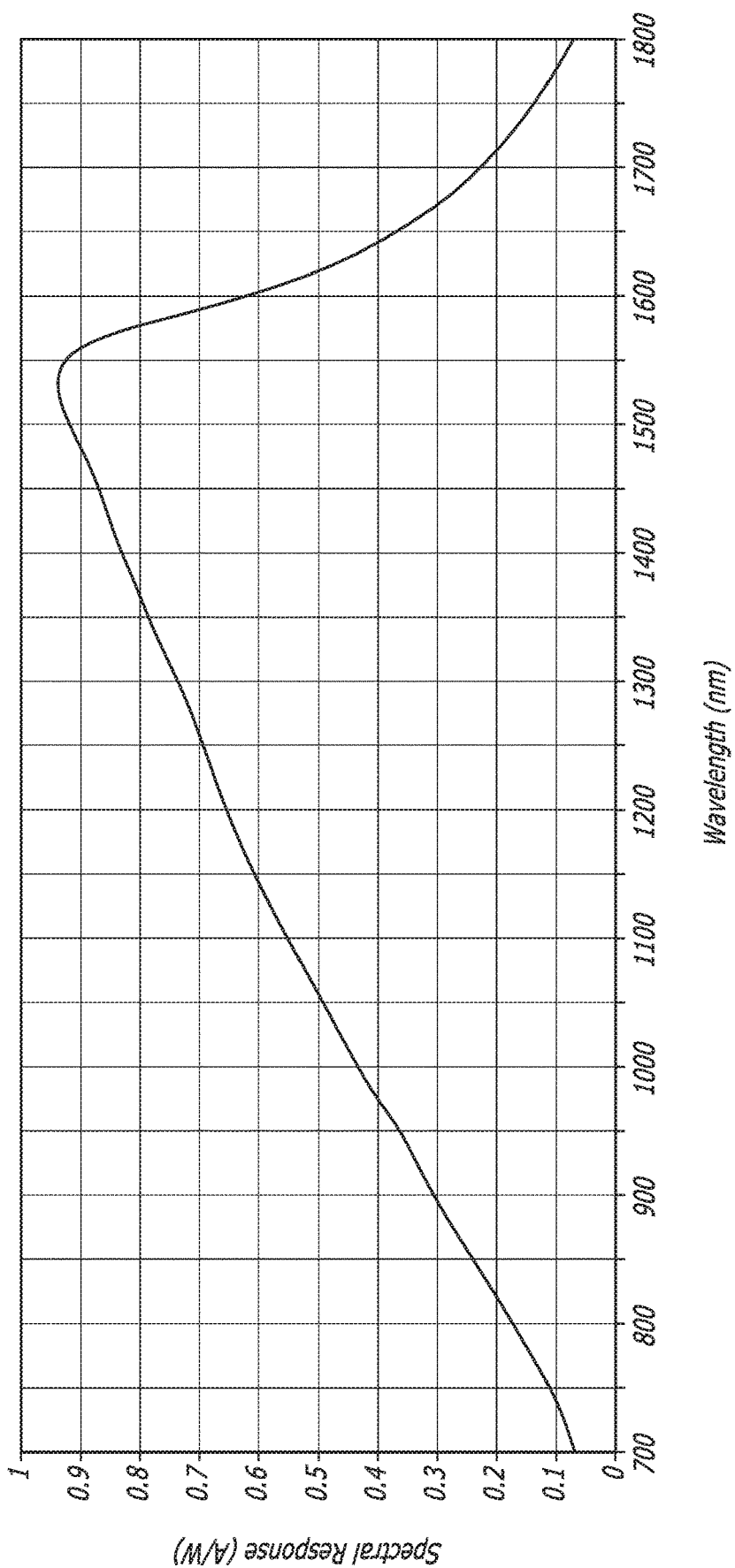
FIG. 2 shows a graph of the spectral response of a typical Germanium photodiode as known in the prior art.
Figure 3:
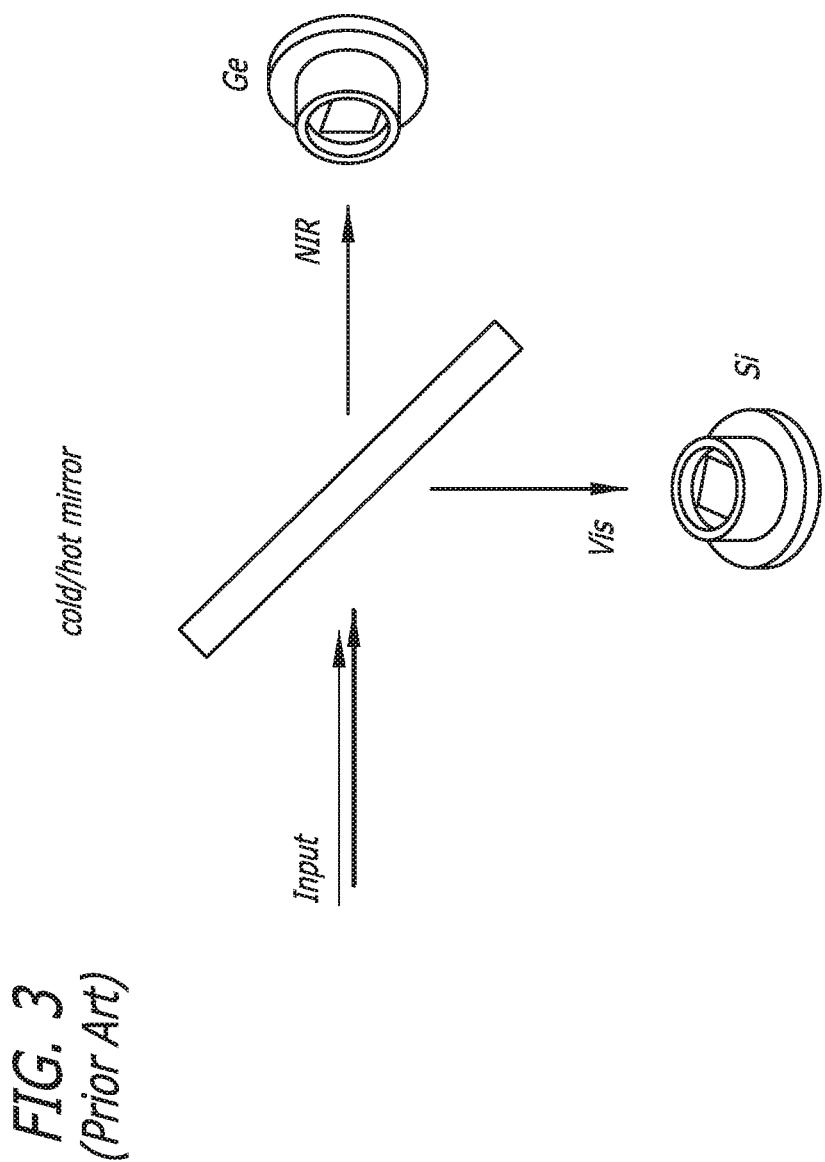
FIG. 3 shows a schematic of an apparatus for using a combination of Silicon-based and Germanium-based photodiodes as known in the prior art.
Figure 4:
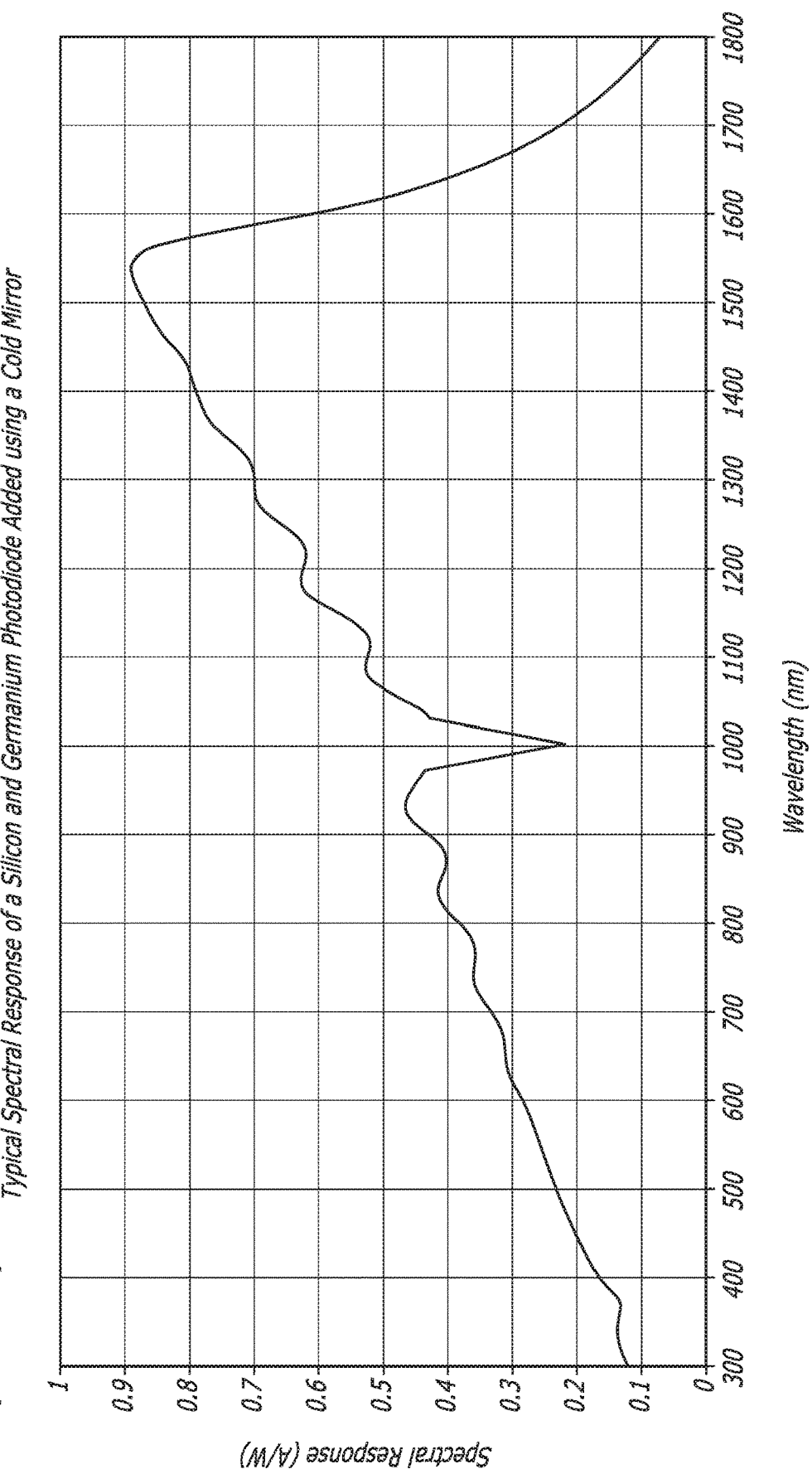
FIG. 4 shows a graph of the spectral response of a combined Silicon & Germanium photodiode as used in the cold mirror arrangement shown in FIG. 3.
Figure 5:
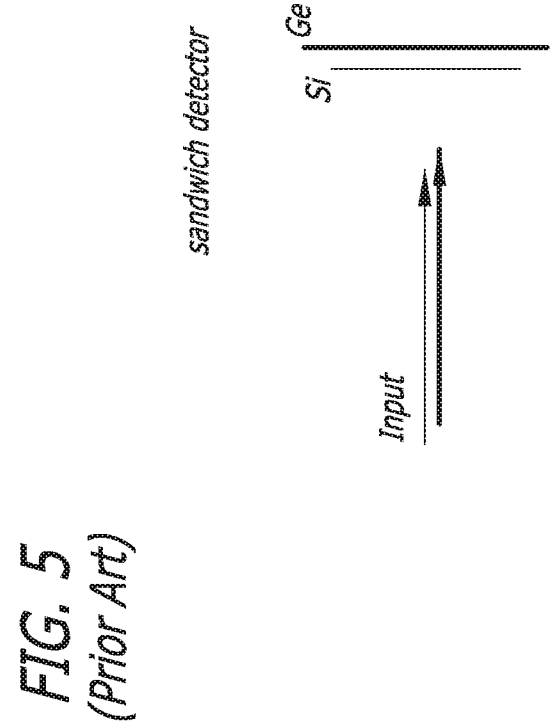
FIG. 5 shows schematic of a combination of Silicon and Germanium photodiodes in a multiple-layer or sandwich configuration as known in the prior art.
Figure 6:
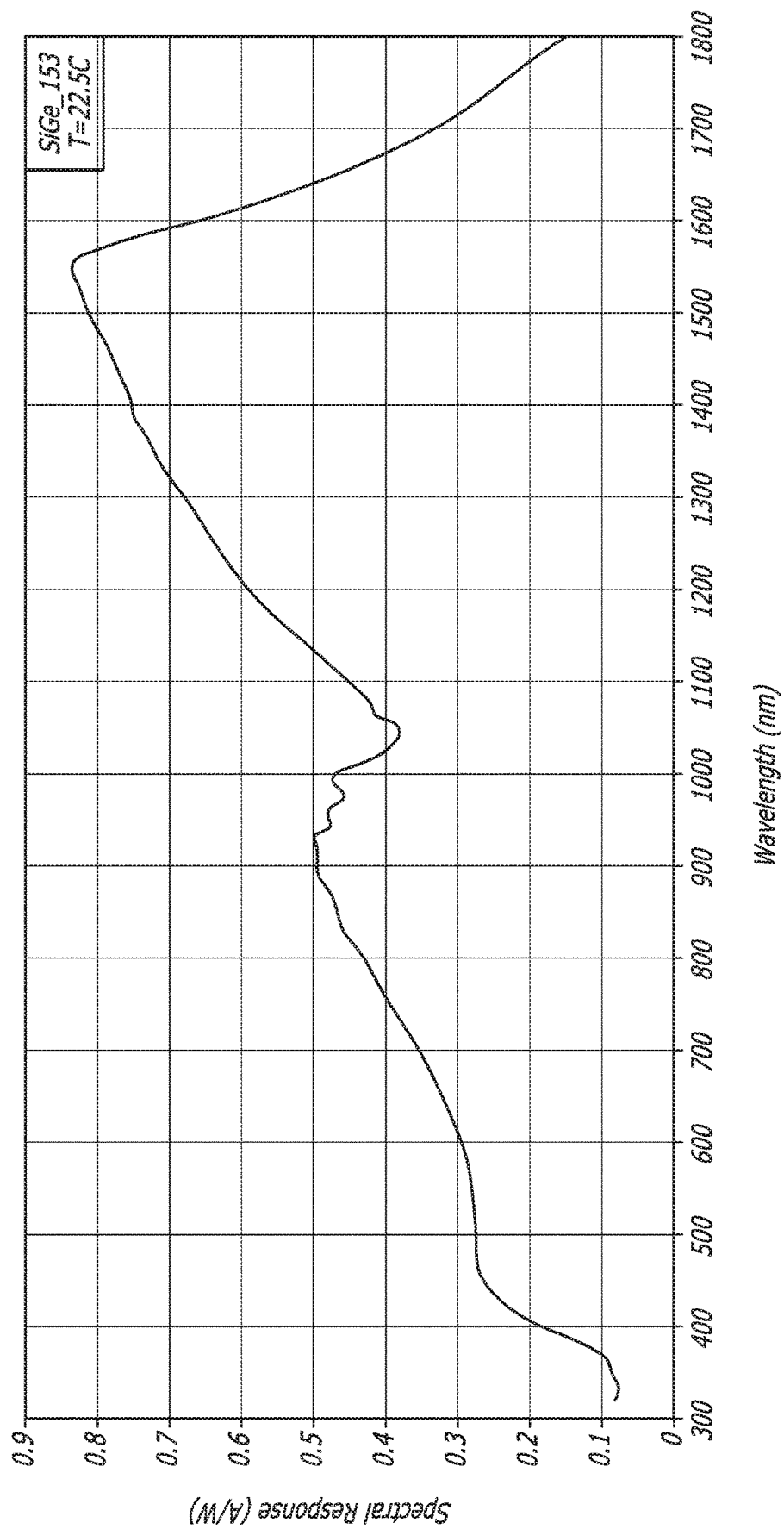
FIG. 6 shows a graph of the spectral response of a combined Silicon & Germanium photodiode as used in the multiple layer or sandwich arrangement shown in FIG. 5 as known in the prior art.
Figure 7:
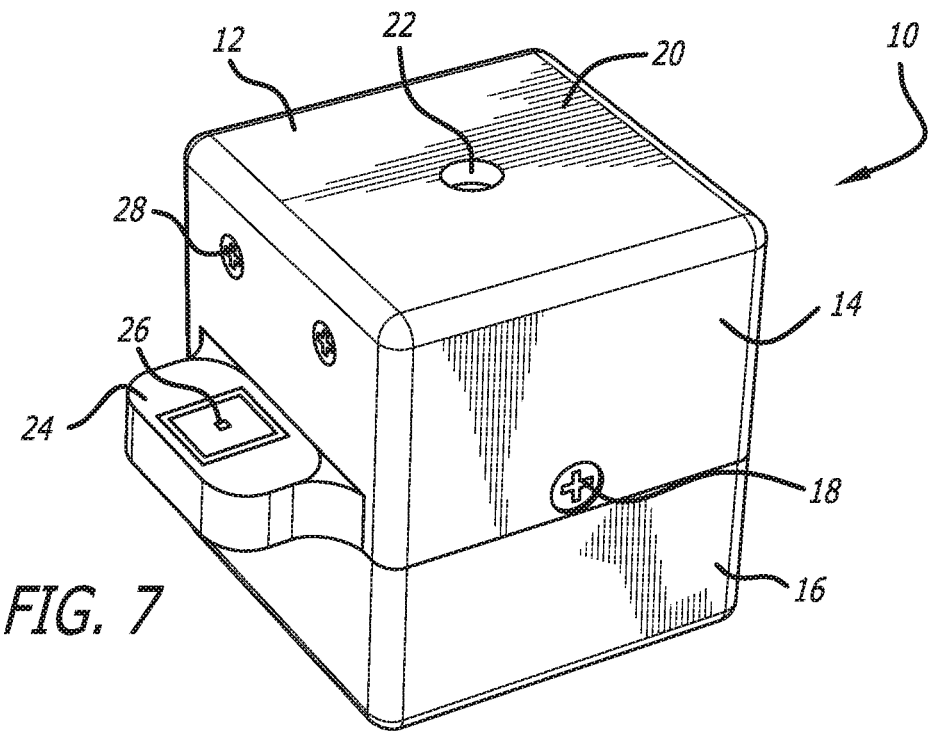
FIG. 7 shows an elevated perspective view of an embodiment of the multi-junction detector device.
Figure 8:
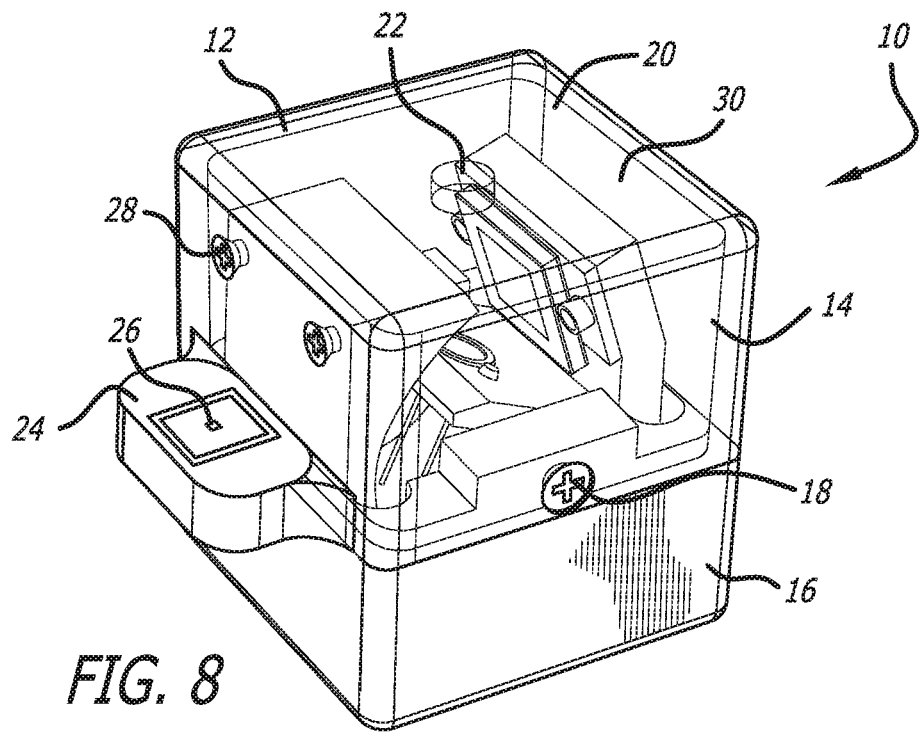
FIG. 8 shows an elevated perspective view of an embodiment of the multi-junction detector device wherein the internal components positioned within a housing as illustrated.

FIGS. 7 and 8 show various views of an exemplary embodiment of a multi-junction detector device. As shown in FIG. 7, the detector device 10 includes at least one detector body 12. In the illustrated embodiment, the detector device body 12 is formed by a first detector housing body 14 and a second detector housing body 16, although those skilled in the art will appreciate that any number of detector housing bodies may be used to form the detector device body 12. In the illustrated embodiment, at least one of the first detector housing body 14 and second detector housing body 16 is constructed of aluminum. In another embodiment, at least one of the first and second detector housing bodies 14, 16 may be manufactured from any variety of materials, including, aluminum, steel, various alloys, composite materials, Delrin®, various polymers, and the like.

Referring again to FIGS. 7 and 8, in the illustrated embodiment the detector device body 12 may include at least one coupling member 18 configured to couple the first detector body housing 14 to the second detector body housing 16 to cooperatively form the detector device body 12. In the illustrated embodiment, the coupling member 18 comprises a threaded screw, although those skilled in the art will appreciate that any variety of coupling devices may be used to couple the first detector body housing 14 to the second detector body housing 16 to form the detector device body 12. For example, the coupling member 18 may comprise at least one friction fit device, lock pin device, or similar device.

Referring again to FIGS. 7 and 8, one or more apertures 22 may be formed on the detector device body 12. In the illustrated embodiment, a single aperture 22 is formed on at least one surface of the first detector housing body 14 of the detector device body 12. For example, the aperture 22 may be formed on a first surface 20 of the first detector housing body 14. Optionally, any number of apertures may be formed at various locations on the detector device body 12. Further, one or more flange members 24 or similar devices may be coupled or otherwise formed on at least one of the first detector housing body 14, second detector housing body 16, or both. In the illustrated embodiment, the flange member 24 may include at least one alignment aid or target 26 positioned thereon. Optionally, the flange member 24 may be useful in coupling the detector device 10 to a work piece support, optical mount, scaffold, and the like.

FIGS. 8-12 show various views of the internal components of the detector device 10. As shown, the at least one housing cavity 30 is formed within at least one of the first detector housing body 14 and the second detector housing body 16. In the illustrated embodiment, a single housing cavity 30 is cooperatively formed by the first and second detector housing bodies 14, 16. Optionally, multiple housing cavities may be formed within the detector body 12 by at least one of the first detector housing body 14 and/or the second detector housing body 16. As such, a single detector body 12 may be configured to contain multiple detector systems therein.

Figure 9:
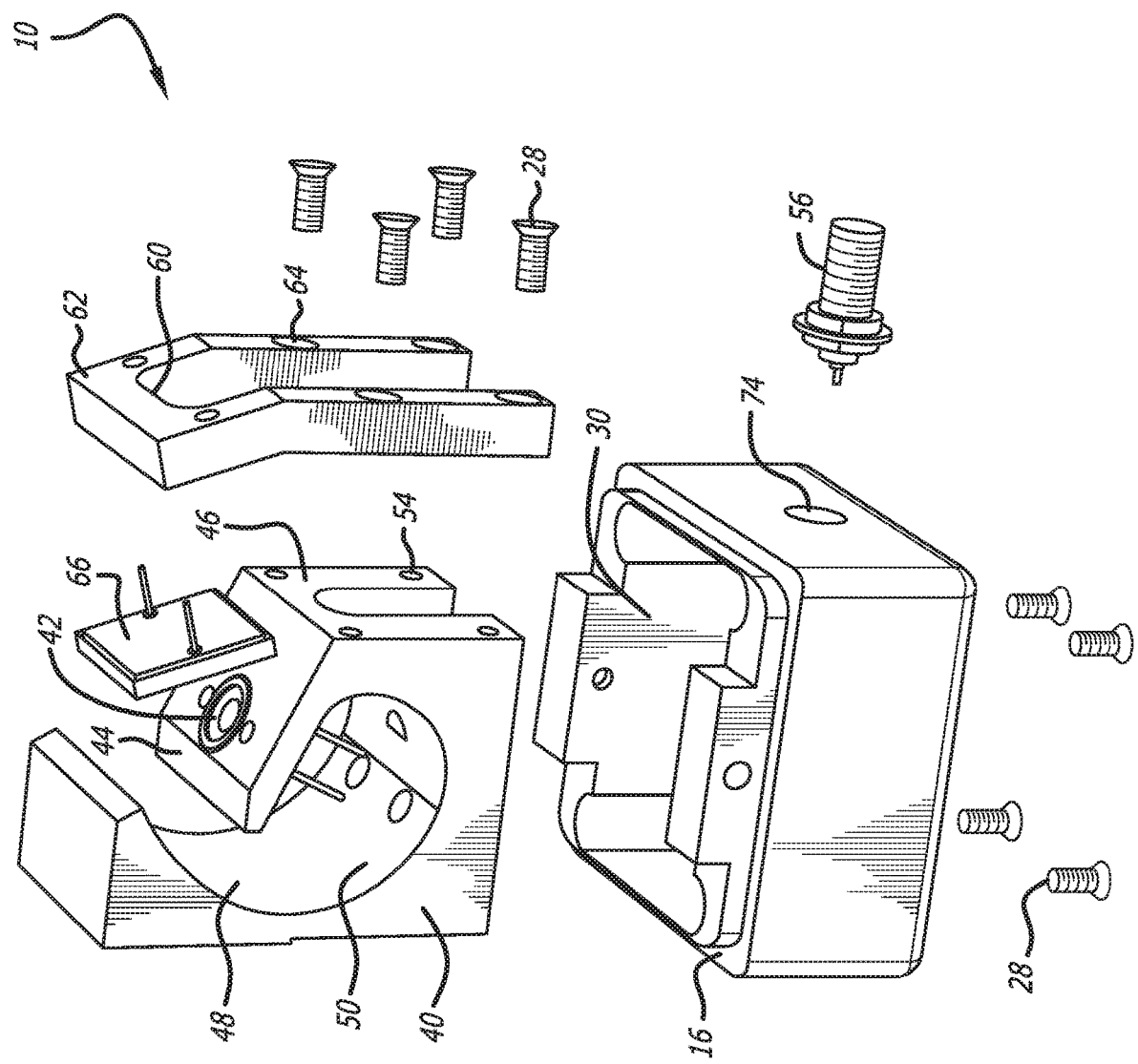
FIG. 9 shows an exploded view of an embodiment of the multi-junction detector device.
Figure 10:
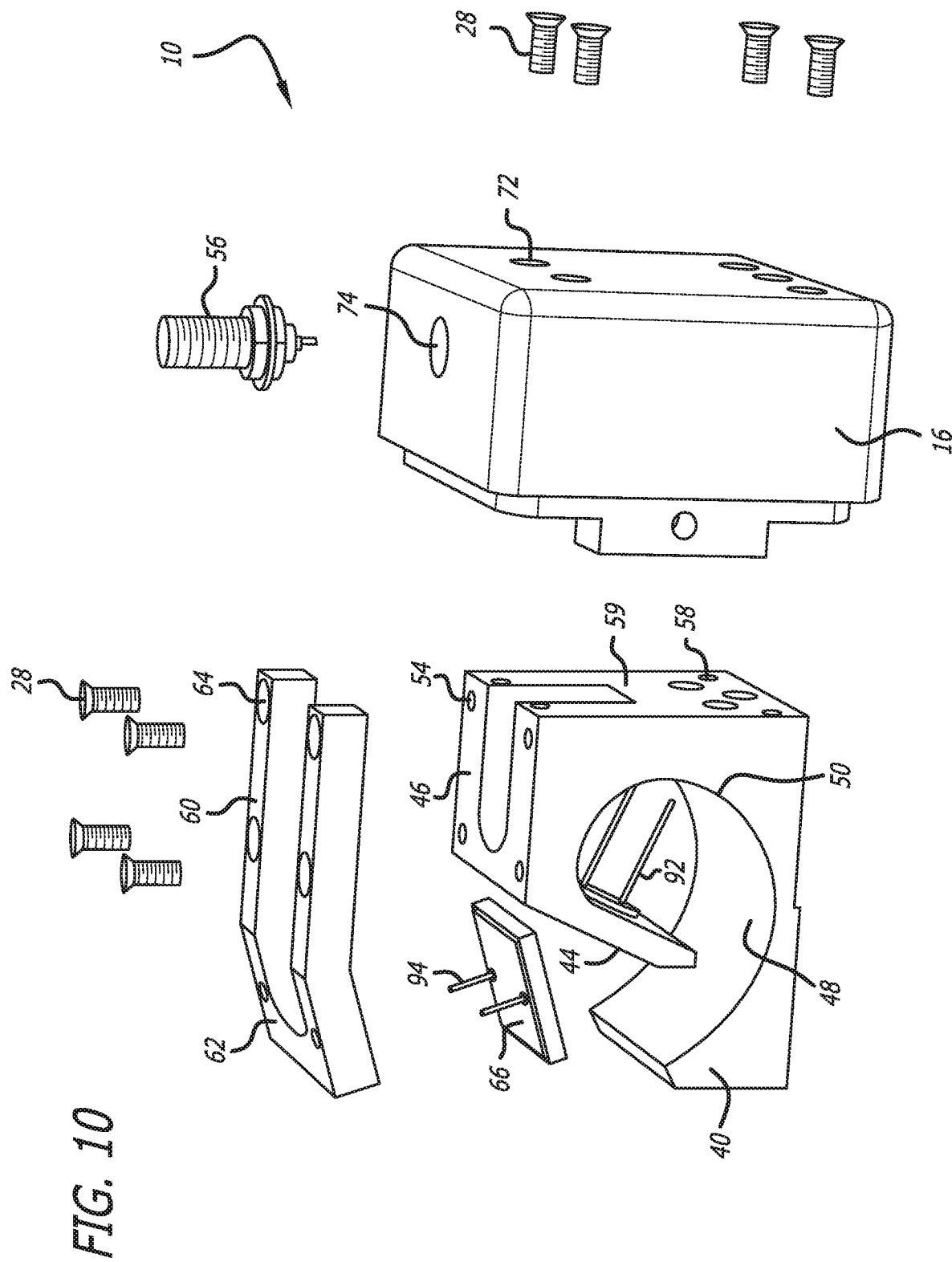
FIG. 10 shows an exploded view of an embodiment of the multi-junction detector device.

As shown in FIGS. 8-10, at least one interface coupling member 56 configured to couple the detector device 10 to at least one processor, computer, power supply, and/or similar interface may be coupled at least one of the first and second detector housing bodies 14, 16. For example, as shown in FIGS. 9 and 10, in one embodiment at least a portion of the interface coupling member 56 may be positioned within or in communication with the housing cavity 30 formed in the detector body 12 via at least one interface coupling member passage 74. In the illustrated embodiment, the interface coupling member 56 comprises a threaded member configured to have at least one conduit (not shown) coupled thereto. Optionally, any number and/or variety of interface coupling member 56 may be used to couple any number of external processing devices (not shown) to the detector device 10. In another embodiment, the interface coupling member 56 may comprise one or more clips or similar friction fit devices configured to couple one or more conduits to the detector device 10. In another embodiment, the detector device 10 may be configured to couple to one or more external processors, computers, networks, power supplies, and the like wirelessly. As such, the interface coupling member 56 may comprise a wireless communication device, Bluetooth device, inductive charging systems, and/or similar communication system. As such, the detector device 10 may include internal processing capabilities, controllers, and the like.

Referring again to FIGS. 8-12, at least one detector system mount body 40 and at least one second detector mount body 60 cooperatively form at least one detector support assembly 52 configured to secure and position one or more detectors within the detector body 12. In one embodiment, at least one of the detector system mount body 40 and the second detector mount body 60 is manufactured from aluminum, although those skilled in the art will appreciate that the detector system mount body 40 and the second detector mount body 60 may be manufactured from any variety of materials, including, without limitations, steel, copper, alloys, titanium, composite materials, ceramic materials, polymers, plastics, nylons, Delrin®, and the like. At least one of the detector system mount body 40 and second detector mount body 60 may be configured to be positioned within the housing cavity 30. For example, in the illustrated embodiments, the detector system mount body 40 is configured to support a first detector 42 and at least a second detector 66 within the housing cavity 30 formed in the detector system mount body 40. For example, in one embodiment the first detector 42 comprises at least one Germanium detector while the second detector 66 comprises at least one Silicon detector. Optionally, any number and variety of detectors may be used in the detector device 10. For example, in an alternate embodiment the first and second detector 42, 66 may comprise an Indium Gallium Arsenide (InGaAs) detector while the second detector comprises Mercury Cadmium Telluride (HgCdTe) detector. Any variety of detectors, including without limitations, Germanium (Ge), Silicon (Si), Gallium Arsenide (GaAs), Lead (II) Sulfide (PbS), Mercury Cadmium Telluride (HgCdTe) Gallium Nitride (GaN), Cadmium Zinc Telluride (CdZnTe), Gallium Phosphide (GaP) and similar detectors may be used with the detector device 10. Optionally, at least one of the detectors may comprise at least one photo-multiplying device. In another embodiment, the detector device 10 may include any variety of detectors, including, without limitations, active pixel sensors, image sensors, bolometers, charge coupled devices, particle detectors, photographic plates, cryogenic detectors, gaseous ionization detectors, reversed-biased LEDs, optical detectors, pyroelectric detectors, Golay cells, thermocouples, thermistors, photoresistors, photovoltaic cells, photodiodes, photoconductive devices, phototransistors, quantum dot photoconductors and photodiodes, semiconductor detectors, silicon drift detectors, and the like. Optionally, the first and second detector 42, 66, respectively, may be manufactured from the sale or different materials. As such, the first and second detectors 42, 66, respectively, may or may not share the same spectral responsivity.

In the embodiments shown in FIGS. 8-13, the first detector 42 is positioned on or otherwise coupled to the detector receiving region 44, which is formed on the detector system mount body 40. In one embodiment, the first detector 42 may be positioned substantially co-planar with the alignment target 26 located on the flange member 24 positioned on an exterior surface of the second housing body 16. As such, the user may focus the incident signal on the alignment aid 26 position on the flange member 24, then laterally reposition the detector device 10 such that the incident signal traverses through the aperture 22 formed on the first housing body 14 and is incident on the first detector 42. In the illustrated embodiment, the detector receiving region 44 is positioned angularly in relation to the incident signal 82 and parallel to the first detector 42 (See FIG. 11). In one embodiment, the first detector 42 is configured to reflect at least a portion of the light incident thereon onto the second detector 66 positioned on the second detector mount body 60.

As shown in FIGS. 8-12, the detector system mount body 40 may include at least one mount receiving surface 46 configured to have at least one second detector mount body 60 coupled thereto. In one embodiment, the mount receiving surface 46 comprises a generally planar surface configured to have the second detector mount body 60 detachably coupled thereto. As such, the mount receiving surface 46 may include one or more fastener recesses or receivers 54 formed therein, the fastener receivers 54 configured to receive at least one fasteners 28. As shown in FIGS. 9 and 10, the fasteners 28 may be configured to traverse through the mount coupling region 64 formed on the second detector mount body 60 and be securely retained within the fastener recesses 54 formed on the mount receiving surface 46 of the detector system mount body 40. The fasteners 28 may also be configured to traverse through one or more fastener receivers 72 formed in the second detector housing body 16 and be securely retained within fastener recesses 58 formed on the mount receiving surface 59. As such, the detector system mount body 40 and second detector mount body 60 may be coupled to the second detector mount housing body 16. Optionally, the second detector mount body 60 may be coupled to the detector system mount body 40 using any variety of alternate coupling devices or methods. For example, the second detector mount body 60 may be coupled to the detector system mount body 40 using friction fit devices, slip fit devices, magnetic coupling devices, pins, latches, adhesives, epoxies, dovetail features, mechanical coupling features and methods, and the like. In an another embodiment, the detector system mount body 40 and second detector mount body 60 may form a monolithic body.

Referring again to FIGS. 8-12, the detector system mount body 40 may include at least one beam dump region or similar energy dissipation trap or mechanism 48. During use, the beam dump region 48 is configured to receive optical radiation therein and absorb and/or dissipate the reflected energy. For example, in the illustrated embodiment the beam dump region 48 includes at least one mount body wall 50 formed in the detector system mount body 40. For example, in the illustrated embodiment the mount body wall 50 comprises an arcuate surface adjacent to a flat surface configured to receive and retain optical radiation within the detector system mount body 40. Alternatively, the mount body wall 50 may have an arcuate shape of varying radius, a polygonal shape, a polyhedral shape or any other shape configured to reflect light into the beam dump region 48. In one embodiment, the mount body wall 50 includes at least one dissipative feature or material applied thereto, the dissipative feature configured to dissipate the optical radiation incident thereon. In another embodiment, the mount body wall 50 may include at least one reflectivity enhancing material applied thereon. Optionally, any number of additional energy dissipating materials, features, and/or devices may be positioned on or proximate to the mount body wall 50, these additional energy dissipating materials configured to reduce or prevent unwanted reflected energy from propagating to at least one of the light source, the first detector 42, and/or the second detector 66. Optionally, at least a portion of the beam dump region 48, the detector system mount body 40, and/or the second detector mount body 60 include heat dissipating features, devices, and/or system formed thereon or in communication therewith. As such, the beam dump region 48, the detector system mount body 40, and/or the second detector mount body 60 may act as a heat sink.

As shown in FIGS. 8-12, the second detector mount body 60 may include at least one detector mounting region 62 configured to have one or more detectors coupled thereto or positioned thereon. As stated above, any variety of detectors 66 may be coupled to the detector coupling region 62, including, without limitations, Silicon (Si), Germanium (Ge) Indium Gallium Arsenide (InGaAs), Cadmium Zinc Telluride (CdZnTe), Mercury Cadmium Telluride (HgCdTe), Gallium Arsenide (GaAs), Lead (II) Sulfide (PbS), Gallium Nitride (GaN) and Gallium Phosphide (GaP) detectors. In the illustrated embodiment, the detector 66 is positioned on the second detector mounting surface 68 positioned proximate to the detector receiver region 44 formed on the detector system mount body 40. Further, as stated above, the second detector 66 is positioned on the second detector mounting surface 68 is configured to receive at least a portion of the light incident on and reflected by the first detector 42 positioned on the detector receiving region 44 formed on the detector system mount body 40.

Figure 11:
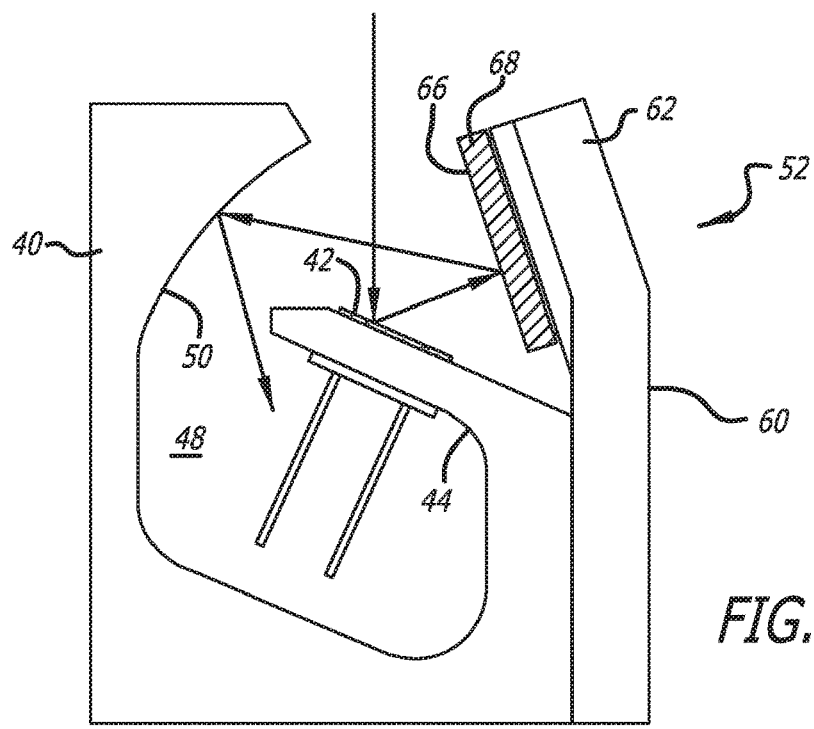
FIG. 11 shows a side view of an embodiment of the multi-junction detector device.
Figure 12:
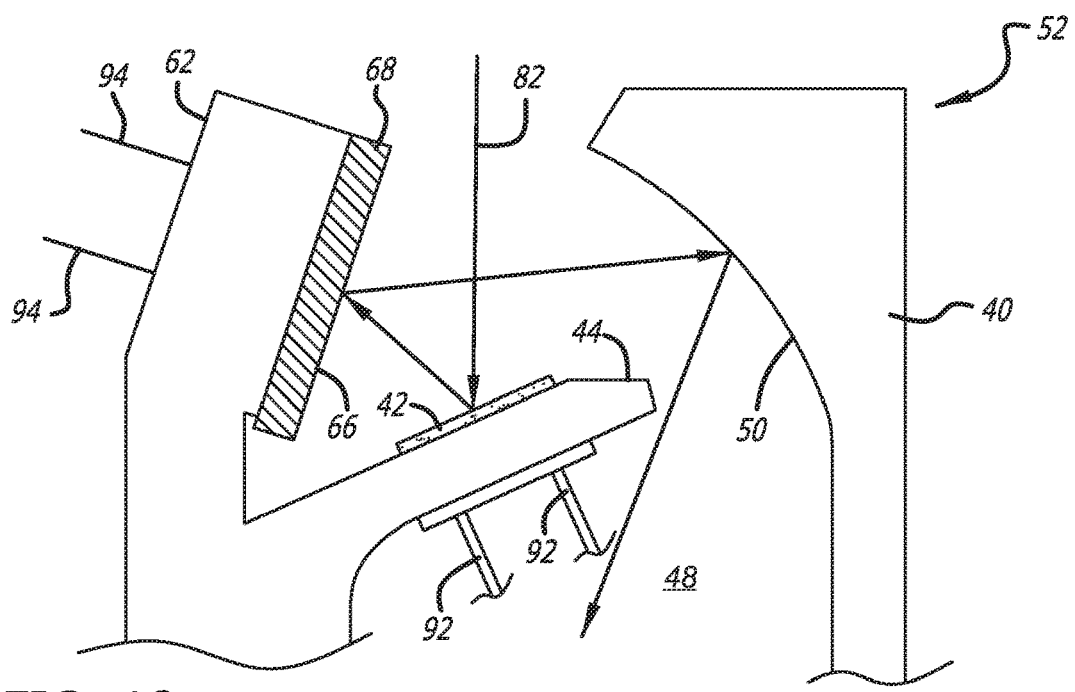
FIG. 12 shows a detailed side view of an embodiment of the multi-junction detector device.
Figure 13:
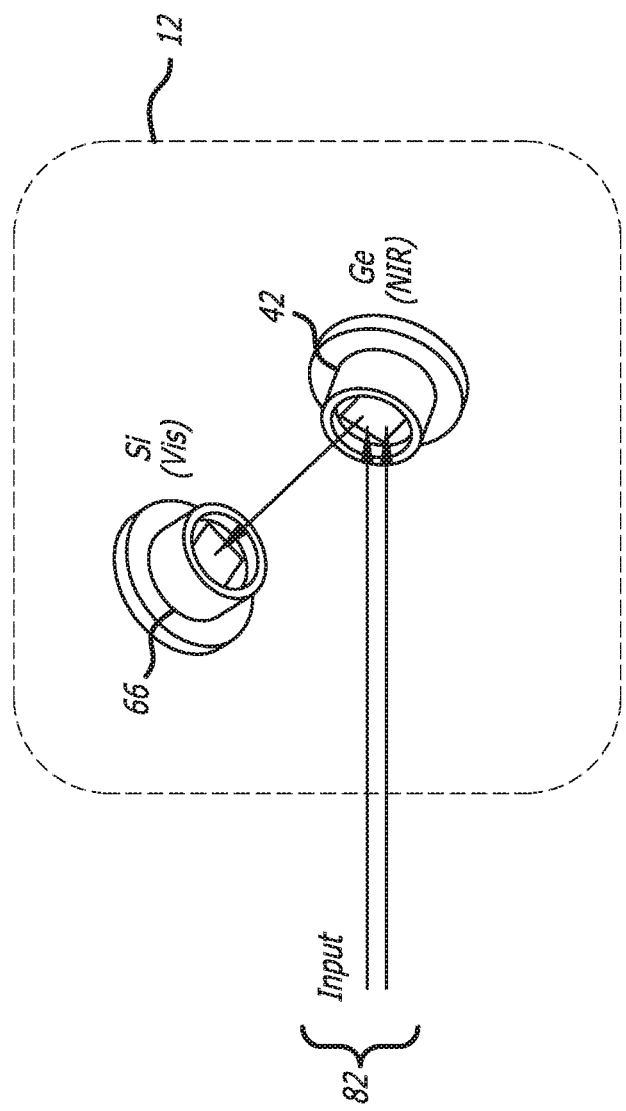
FIG. 13 shows a schematic representation of an embodiment of the multi-junction detector device, showing an optical signal partially absorbed and partially reflected by the Germanium and Silicon photodiodes, respectively.

As shown in FIGS. 11 and 12, during use an incoming optical signal 82 is incident on the first detector 42 positioned on the detector receiving region 44 of the detector system mount body 40. The first detector 42 may generate an output signal (optical, electrical, etc.) which may be sent via at least one conduit 92 coupled to the interface coupling member 56 to one or more circuits, processors, networks, computers, or the like proportional to its responsivity. As such, the first detector 42 may be in communication with the interface coupling member 56 via at least one internal conduit 92 or similar communication device. As shown, the first detector 42 is angularly positioned proximate to the second detector 66 positioned on the second detector receiving surface 68 of the second detector mount body 60. As such, at least a portion of the optical signal 82 incident on the first detector 42 may be reflected from the surface of the first detector 42 and is incident on the second detector 66, which, like the first detector 42, may be in communication with the interface coupling member 56 via at least one internal conduit 94 or communication device. As such, the second detector 66 coupled to the interface coupling member 56 may be in communication with one or more processors, networks, computers, or the like.

Figure 14:
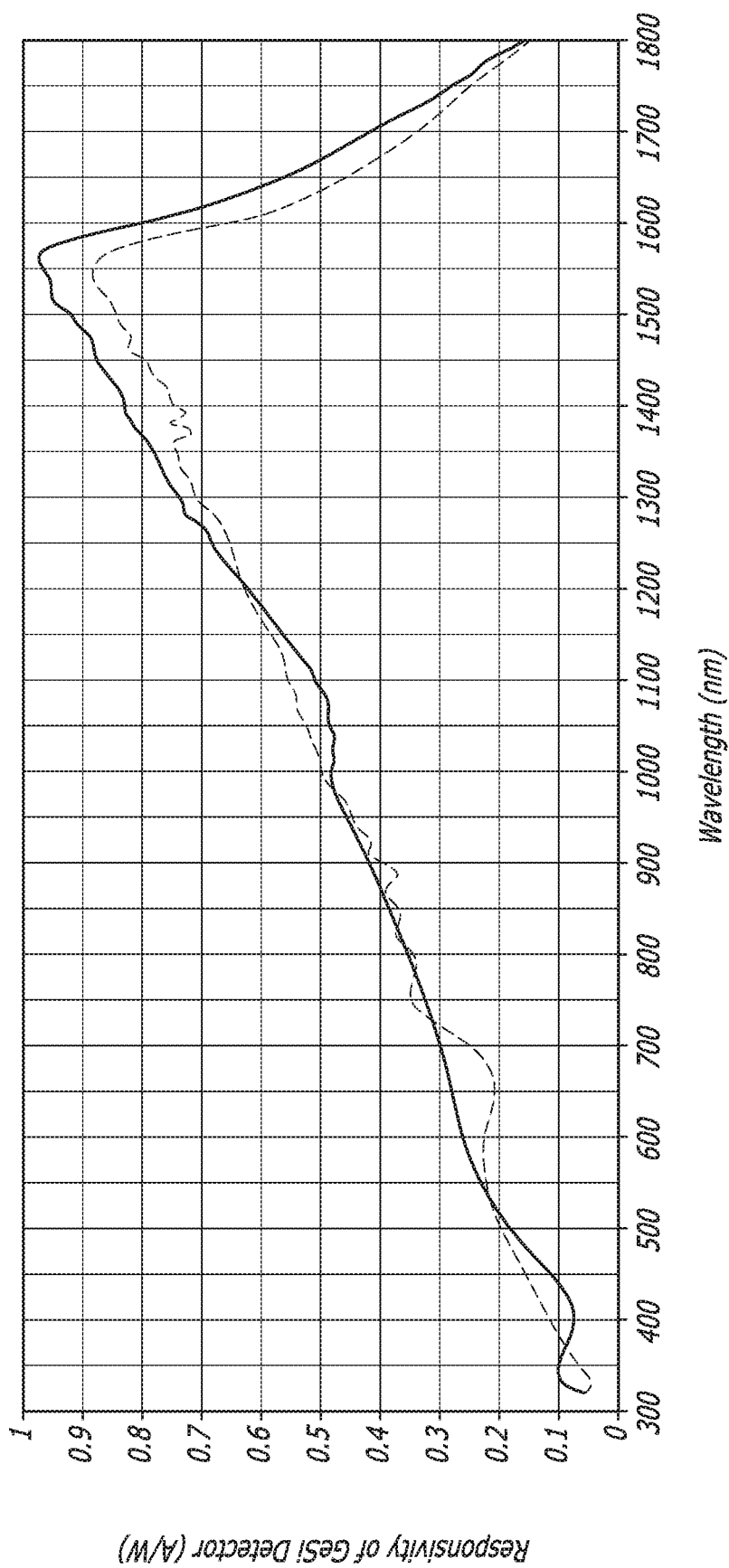
FIG. 14 shows a graph of the spectral responsivity of an embodiment of the multi-junction detector device.

Referring again to FIGS. 11 and 12, the second detector 66 may generate at least one output signal in response to the reflected light 82 being incident thereon. In a more specific embodiment, the first detector 42 may comprise a Germanium detector having a desired spectral responsivity from about 800 nm to about 1800 nm, while the second detector comprises a Silicon detector having a desired spectral responsivity from about 180 nm to about 1100 nm. The detectors 42, 66 may be configured to measure various characteristics of the signal 82, including, without limitations, wavelength, power, spectral characteristics, and the like. As such, the spectral characteristics of an incoming signal 82 comprised of any number of wavelengths from about 180 nm to about 1800 nm may be accurately measured using the detector device 10 described herein. For example, the portion of the incident signal having a wavelength from about 180 nm to about 1100 nm would be reflected off the surface of the first detector 42, which is substantially non-responsive to light within this spectral range, and is reflected on to the second detector 66, which is highly responsive to light from about 180 nm to about 1100 nm. In contrast, an incoming signal 82 having a wavelength of about 800 nm to about 1800 nm would be measured by the first detector 42, which is highly responsive to light having a wavelength from about 800 nm to about 1800 nm. Thereafter, any light having a wavelength from about 800 nm to about 1800 nm reflected on to the second detector 66, which is substantially non-responsive to light having a wavelength of greater than about 1100 nm would be reflected by the surface of the second detector 66 to the beam dump region 48. As a result, the user may easily and accurately characterize the spectral responsivity of the incident signal 82 and/or detector response of the detector system 10 from about ultraviolet wavelengths (about 180 nm) to infrared wavelengths (about 1800 nm) without requiring the user to switch the between multiple detectors. For example, FIG. 14 shows graphically the theoretical spectral responsivity as compared with the actual spectral responsivity of the detector device 10 described herein. As shown, unlike prior art detector configurations, the detector device 10 described herein fails to exhibit the spectral gap in responsivity from about 900 nm to about 1100 nm. Optionally, while the embodiments disclosed above are directed to configurations incorporating two detectors, those skilled in the art will appreciate that the detector device 10 described herein may be easily adapted to incorporate any number of detectors therein.

Figure 15:
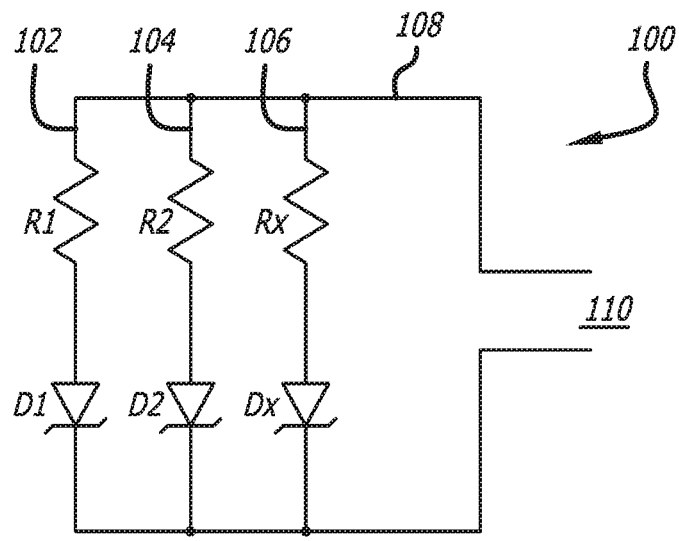
FIG. 15 shows a schematic diagram of an embodiment of the multi-junction detector device wherein the circuit paths are configured in parallel.

FIGS. 10-12 and 15-19 show various embodiments of circuits which may be used with the detector device described above. Unlike prior art systems, the various embodiments of the circuits shown in FIGS. 15-19 are configured to sum the outputs of the first detector 42 and second detector 66 to produce the graphical representation of the responsivity (See FIG. 14) of the detector device 10 described above. For example, as shown in FIG. 15, in one embodiment the circuit 100 includes multiple circuit paths 102, 104, and 106 in parallel. Each circuit path 102, 104, and 106 includes at least one detector or photodiode D1, D2, Dx and at least one resistor R1, R2, and Rx associated with each detector. As such, the first circuit path 102 includes detector D1 and resistor R1, the second circuit path 104 includes detector D2 and resistor R2, and the third circuit path 106 includes detector Dx and resistor Rx. The various circuit paths are coupled via one or more conduits 108 to one or more amplifiers and/or output components 110. Those skilled in the art will appreciate any number of circuit paths may be used with the detector system 10. Further, those skilled in the art will appreciate that at least one of the circuit paths may include any number of additional or alternate components, including, without limitations, diodes, resistors, capacitors, triodes, operational amplifiers, amplifiers, and the like. Optionally, the output device 110 may comprise at least one amplifier or similar device. In another embodiment, the output device 110 comprises at least one processor, analyzing device, and/or computer. Those skilled in the art will appreciate that any variety of devices may be used as an output device, including, without limitations, external circuits, computer networks, amplifiers, processing devices, and the like.

Figure 16:
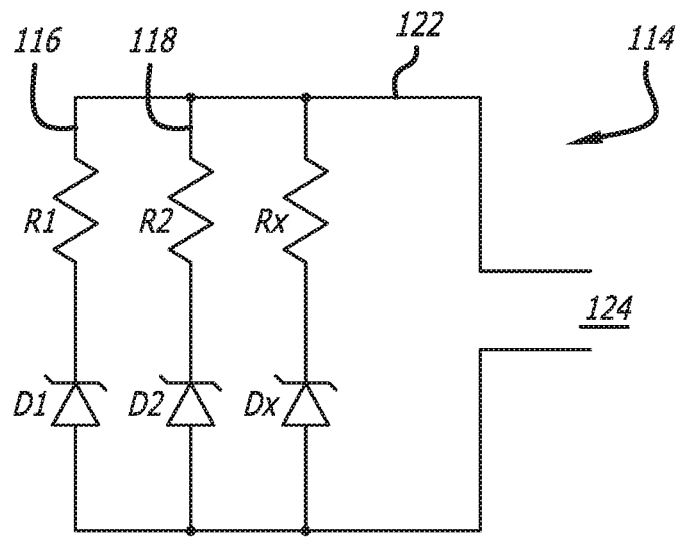
FIG. 16 shows an electrical schematic of an alternate embodiment of the multi-junction detector device wherein the photodiodes in the parallel circuit paths are reversed-biased.

FIG. 16 shows an alternate embodiment of a circuit device used with the detector device 10 shown above. Like the previous embodiment, the circuit 114 shown in FIG. 16 includes multiple circuit paths 116, 118, and 120 in parallel. The circuit path 116, 118, and 120 includes at least one reverse-biased detector or photodiode D1, D2, Dx and at least one resistor R1, R2, and Rx associated with each detector. The various circuit paths 116, 118, and 120 are coupled via one or more conduits 122 to one or more amplifiers and/or output components 124. Those skilled in the art will appreciate any number of circuit paths may be used with the detector system 10. Further, those skilled in the art will appreciate that at least one of the circuit paths may include any number of additional or alternate components, including, without limitations, diodes, resistors, capacitors, triodes, operational amplifiers, amplifiers, and the like.

Like the previous embodiment, the output device 124 may comprise at least one amplifier or similar device. In another embodiment, the output device 124 comprises at least one processor, analyzing device, and/or computer. Those skilled in the art will appreciate that any variety of devices may be used as an output device, including, without limitations, external circuits, computer networks, amplifiers, processing devices, and the like.

Figure 17:
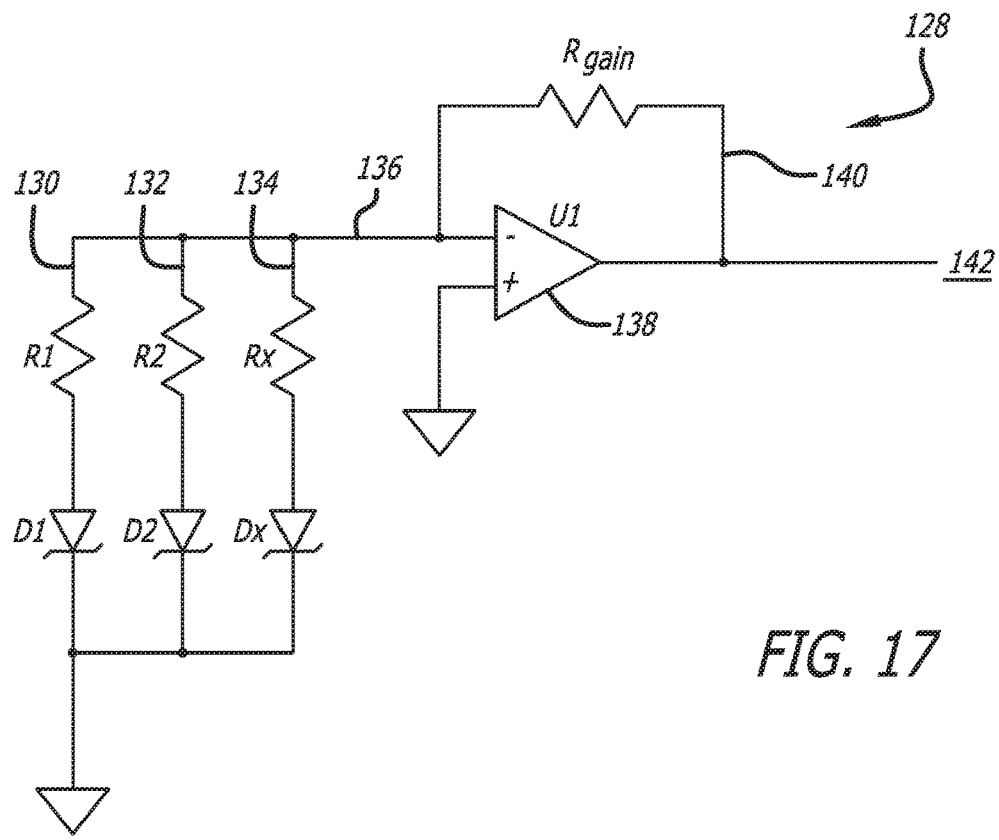
FIG. 17 shows an electrical schematic of an embodiment of the multi-junction detector device wherein the output of the parallel circuit paths is fed to an operational amplifier.
Figure 18:
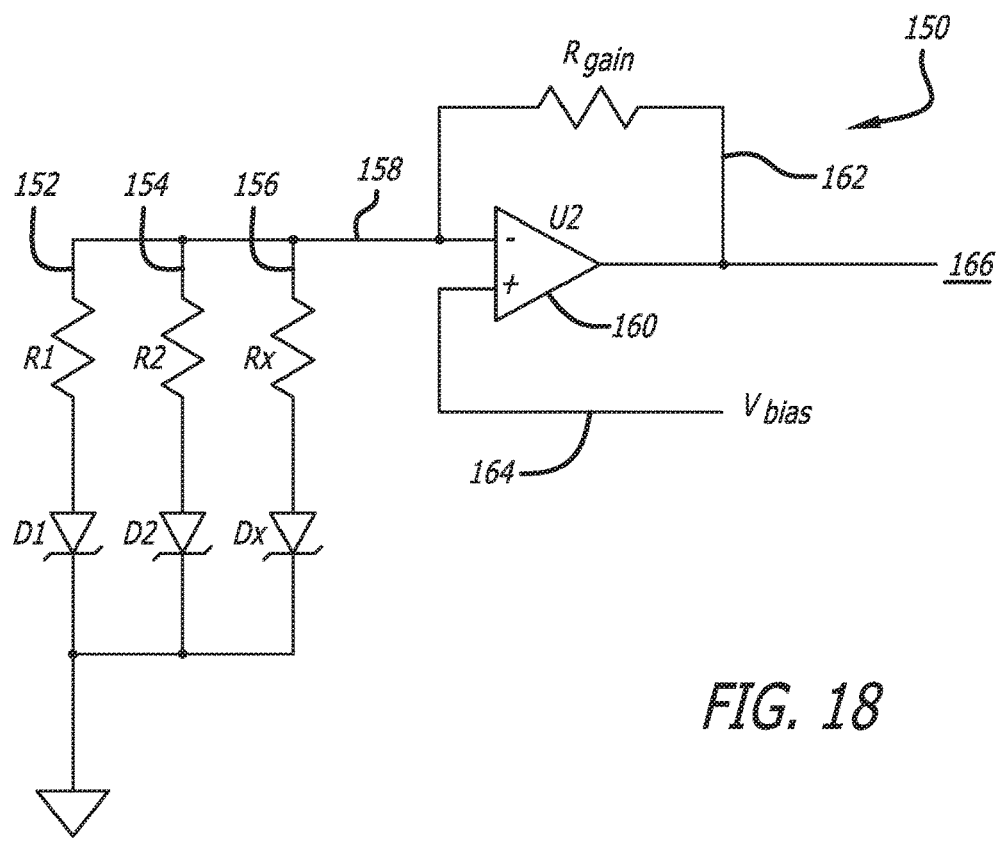
FIG. 18 shows an electrical schematic of an embodiment of the multi-junction detector device wherein the output of the parallel circuit paths is fed to an operational amplifier that is voltage-biased.
Figure 19:
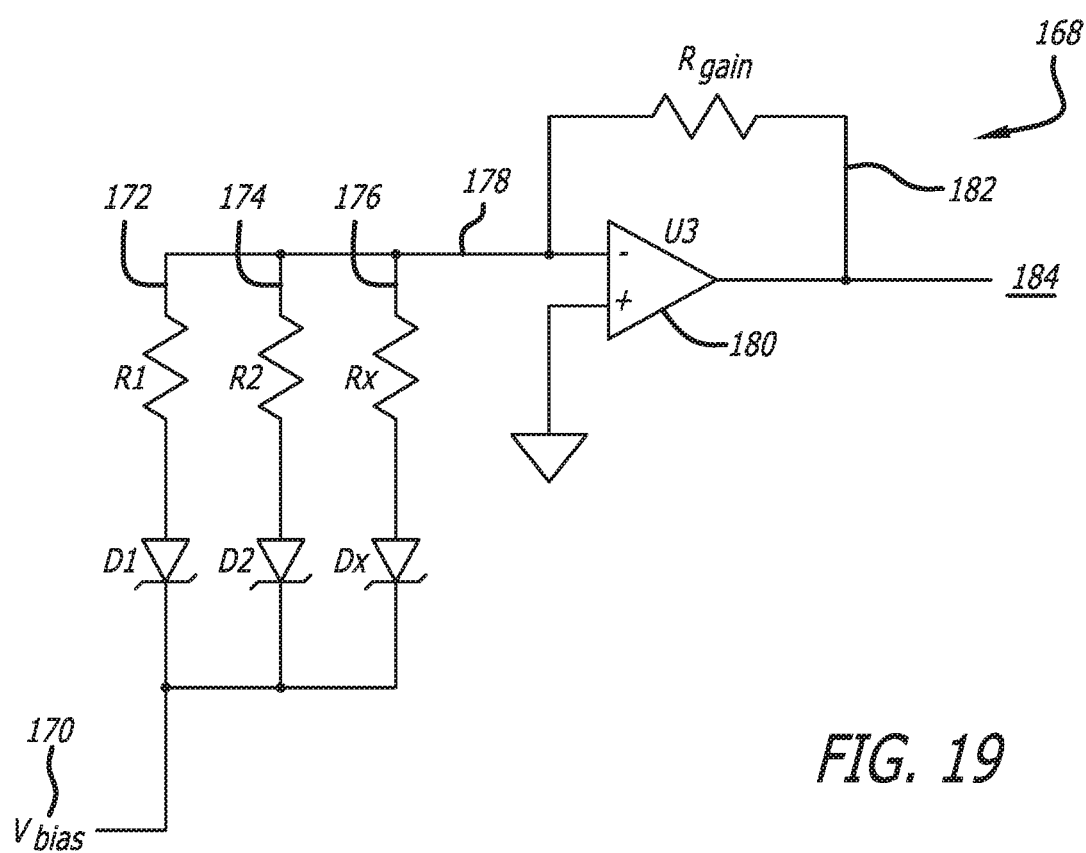
FIG. 19 shows an electrical schematic of an embodiment of the multi-junction detector device wherein the parallel circuit paths are voltage-biased and connected to an operational amplifier.

FIGS. 17-19 show various embodiments of circuits which include at least one operational amplifier (hereinafter op-amp) therein which may be used with the detector device described above. As shown in FIG. 17, in one embodiment the circuit 128 includes multiple circuit paths 130, 132, and 134 in parallel. Each circuit path 130, 132, and 134 includes at least one detector or photodiode D1, D2, Dx and at least one resistor R1, R2, and Rx associated with each detector. The various circuit paths are coupled via one or more conduits 136 to one or more op-amps 138. The op-amp 138 may include at least one gain or feedback circuit 140 having one or more resistors $R_{gain}$ or other components positioned therein. Exemplary other components include, without limitations, capacitors, inductors, diodes, and other passive and/or active components known in the art. At least one output device 142 may comprise the output of the op-amp 138. In one embodiment, the output device 142 comprises at least one processor, analyzing device, and/or computer. Those skilled in the art will appreciate that any variety of devices may be used as an output device, including, without limitations, external circuits, computer networks, amplifiers, processing devices, and the like.

FIG. 18 shows an alternate embodiment the circuit for use with the detector device 10 shown above. As shown, the circuit 150 includes multiple circuit paths 152, 154, and 156 in parallel. Like the previous embodiment, each circuit path 152, 154, and 156 includes at least one detector or photodiode D1, D2, Dx and at least one resistor R1, R2, and Rx associated with each detector. The various circuit paths are coupled via one or more conduits 158 to one or more op-amps 160. The op-amp 160 may include at least one gain or feedback circuit 162 having one or more resistors $R_{gain}$ or other components positioned therein. Further, at least one input 164 of the op-amp 160 is voltage biased, with input 164 providing a bias voltage $V_{bias}$. At least one output device 166 is coupled to the output of the op-amp 160. In one embodiment, the output device 166 comprises at least one processor, analyzing device, and/or computer. Those skilled in the art will appreciate that any variety of devices may be used as an output device, including, without limitations, external circuits, computer networks, amplifiers, processing devices, and the like.

FIG. 19 shows another embodiment the circuit for use with the detector device 10 shown above. As shown, the circuit 168 includes multiple circuit paths 172, 174, and 176 in parallel. Like the previous embodiment, each circuit path 172, 174, and 176 includes at least one detector or photodiode D1, D2, Dx and at least one resistor R1, R2, and Rx associated with each detector. Further, at least one of the circuit paths 172, 174, and 176 is in communication with at least one voltage bias device 170 that provides a bias voltage $V_{bias}$. The various circuit paths 172, 174, and 176 are coupled via one or more conduits 178 to one or more op-amps 180. The op-amp 180 may include at least one gain or feedback circuit 182 having one or more resistors $R_{gain}$ or other components positioned therein. Further, at least one output device 184 is coupled to the output of the op-amp 180. In one embodiment, the output device 184 comprises at least one processor, analyzing device, and/or computer. Those skilled in the art will appreciate that any variety of devices may be used as an output device, including, without limitations, external circuits, computer networks, amplifiers, processing devices, and the like.

Figure 20:
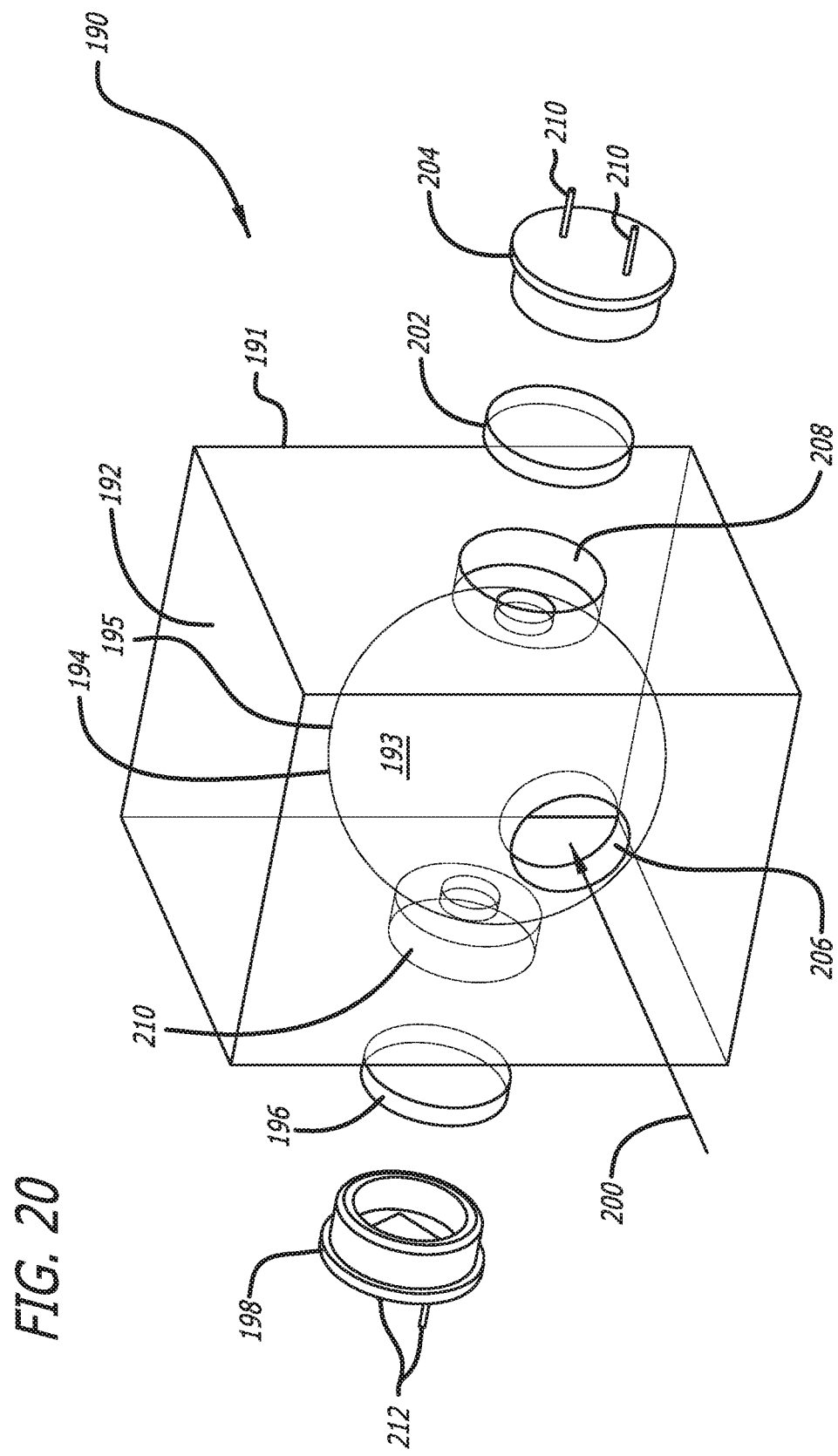
FIG. 20 shows a detailed view of an embodiment of the multi-junction detector device using a single integrating sphere wherein the internal components position within the housing are shown.

FIG. 20 shows an embodiment of the multi-junction detector device 190 using a housing 191 with an integrating sphere body 192 and at least one integrating sphere surface 194 formed in the integrating sphere body 192 and defining at least one volume 193. In the illustrated embodiment, the integrating sphere body 192 is manufactured from Spectralon®. Alternatively, the integrating sphere body 192 may be manufactured from aluminum, bronze, copper, steel, corrosion-resistant steels, plastics, composite materials, and the like. In the illustrated embodiment, the integrating sphere surface 194 is coated with at least one coating 195. Exemplary coatings 195 include PTFE (Teflon®), sintered PTFE, Spectralon®, Spectraflect® Delrin®, Infragold®, silver, gold, chromium or other coatings typically used with integrating spheres. Alternatively, the integrating sphere surface 194 may be modified by polishing or roughing the integrating sphere surface 194 by bead blasting or similar processing to attain the desired reflectance or diffusion of an input optical signal. In the illustrated embodiment, the surface 194 and/or the coating 195 are configured to be highly reflective over a spectral range of at least 180 nm to 1800 nm. In addition, the surface 194 or the coating 195 are configured to be highly scattering following at least a Lambertian profile, a Gaussian profile or a combination thereof or other highly scattering profiles that scatter the incident optical signal 200 between 0 degrees and equal to or less than 90 degrees from the surface normal. Alternatively, there may be no coating applied to the surface 194. In the illustrated embodiment, ports 208 and 210 are formed in the integrating sphere body 192 on opposing sides of the integrating sphere body 192 and in optical communication with the volume 193. Alternatively, any number of ports may be formed anywhere and at any orientation in the integrating sphere body 192 in optical communication with volume 193. In the illustrated embodiment, a first detector 204 is disposed in port 208 and at least a second detector 198 is disposed in port 210. In the illustrated embodiment, one or more optical elements 196 and 202 are disposed in ports 210 and 208 respectively. The optical elements 196 and 202 may be used to adjust the spectral response of the respective detectors 198 and 204. Exemplary optical elements 196 and 202 include, without limitation, optical diffusers, optical filters, polarizers, waveplates, prisms, gratings, lenses, and the like. Alternatively, optical elements 196 and 202 may comprise multiple sub-elements that are stacked, bonded to each other, bonded to the detector surface, or not used at all. An incident optical signal 200 enters the integrating sphere body 192 through at least one inlet port 206 formed in the integrating sphere body 192 and is incident upon the integrating sphere surface 194 and/or the coating 195. The integrating sphere surface 194 or the coating 195 reflects and/or diffuses the incident optical signal 200 within the volume 193. Light with a first spectral range is absorbed by the first detector 198 and light with a second spectral range is absorbed by the second detector 204. For example, the portion of the incident signal having a wavelength range from about 180 nm to about 1100 nanometers may be reflected from the surface of the first detector 198 which is substantially non-responsive to light within this spectral range, and is absorbed by the second detector 204, which is responsive to light from about 180 nm to about 1100 nm. In contrast, an incoming signal having a wavelength range of about 800 nm to about 1800 nm would be absorbed by the first detector 198 which is responsive to light with a wavelength from about 800 to about 1800 nm. The first detector 198 may generate an output signal (optical, electrical, etc.) which may be sent via at least one conduit 212 coupled to the interface coupling member 56 to one or more processors, networks, computers, or the like proportional to its responsivity. As such, the first detector 198 may be in communication with the interface coupling member 56 via at least one internal conduit 212 or similar communication device. At least a portion of the optical signal 200 incident on the first detector 198 may be reflected from the surface of the first detector 198 and is incident on the second detector 204, which, like the first detector 198, may be in communication with the interface coupling member 56 via at least one internal conduit 210 or communication device. As such, the second detector 204 coupled to the interface coupling member 56 may be in communication with one or more processors, networks, computers, or the like. Those skilled in the art will appreciate that any integrating sphere configuration, any number or variety of detectors, or any number or variety of optical elements may be used to measure the incident optical signal.

Figure 21:
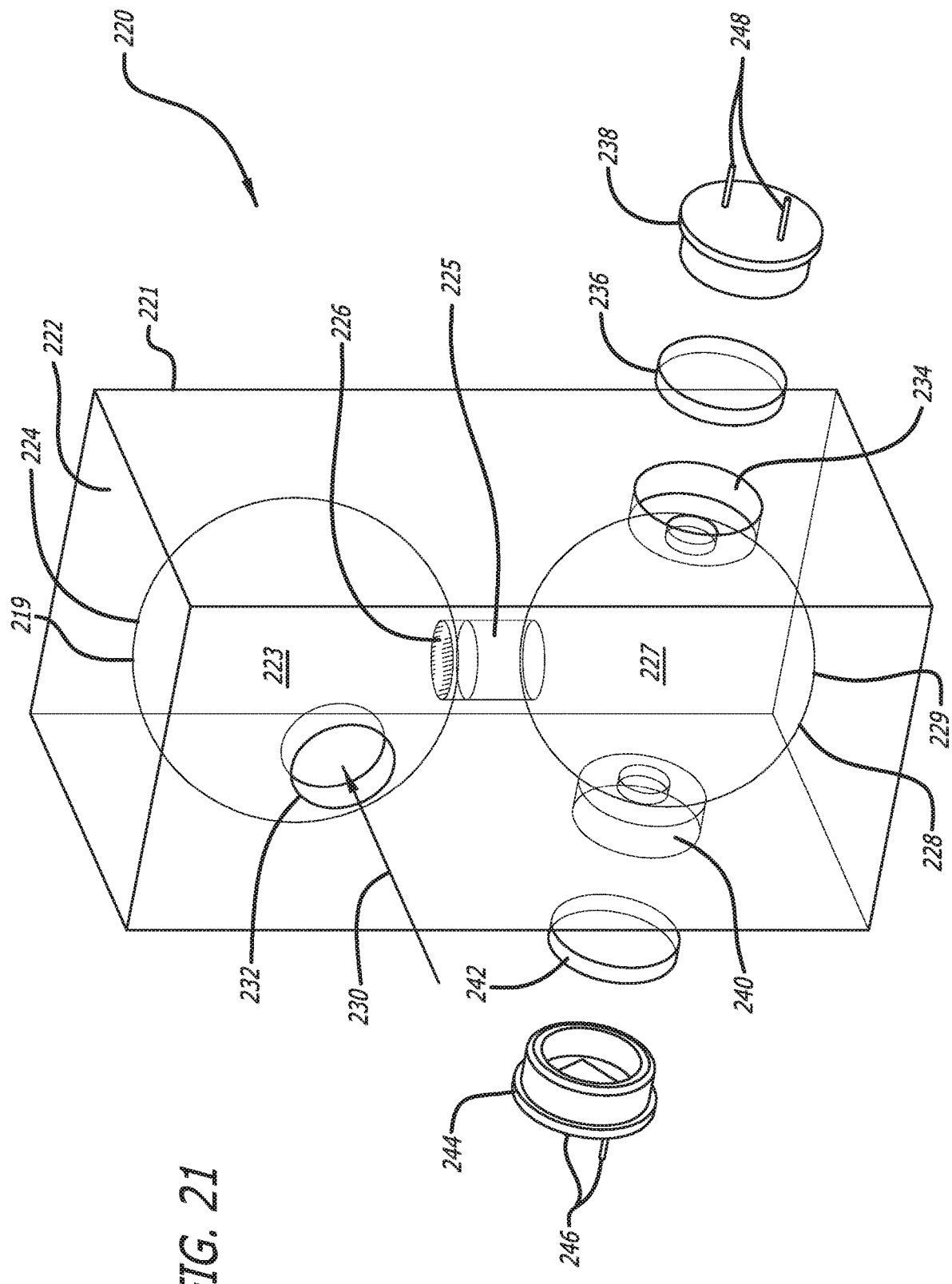
FIG. 21 shows a detailed view of an embodiment of the multi-junction detector device using multiple integrating spheres wherein the internal components position within the housing are shown.

FIG. 21 shows an embodiment of the multi-junction detector device 220 using a housing 221 with an integrating sphere body 222, a first integrating sphere surface 224 formed in the integrating sphere body 222 and defining a first volume 223, at least a second integrating sphere surface 228 formed in the integrating sphere body 222 and defining a second volume 227. In the illustrated embodiment, at least one aperture 225 is formed between the first volume 223 and the second volume 227 so that the first volume 223 and the second volume 227 are in optical communication. Alternatively, the first volume 223 and the second volume 227 may be positioned in close proximity to each other such that a portion of the incident optical signal 230 may scatter from volume 223 into volume 227. In the illustrated embodiment, at least one optical element 226 is disposed in the aperture 225. Alternatively, there may be no optical element disposed in the aperture 225. Exemplary optical elements 226 include, without limitation, optical diffusers such as frosted or ground glass or plastics, engineered diffusers in glass or plastics; optical filters, polarizers, waveplates, prisms, gratings, lenses, nonlinear crystals, saturable absorbers, phosphor-coated substrates and the like. At least one incident light signal 203 enters the first volume 223 through at least one port 232 formed in the integrating sphere body 222 and is reflected and/or diffused by the integrating sphere surface 224 or coating 219 such that at least a portion of the incident light enters the second volume 227 through the aperture 225. The integrating sphere surface 228 or the coating 229 reflects and/or diffuses the incident light signal 230 within the second volume 227. Light with a first spectral range is absorbed by the first detector 244 and light with a second spectral range is absorbed by the second detector 238. For example, the portion of the incident signal having a wavelength range from about 180 nm to about 1100 nanometers would be reflected off the surface of the first detector 244 which is substantially non-responsive to light within this spectral range, and is absorbed by the second detector 238, which is responsive to light from about 180 nm to about 1100 nm. In contrast, an incoming signal having a wavelength range of about 800 nm to about 1800 nm would be absorbed by the first detector 244 which is responsive to light with a wavelength from about 800 to about 1800 nm. The first detector 244 may generate an output signal (optical, electrical, etc.) which may be sent via at least one conduit 246 coupled to the interface coupling member 56 to one or more processors, networks, computers, or the like, proportional to its responsivity. As such, the first detector 244 may be in communication with the interface coupling member 56 via at least one internal conduit 246 or similar communication device. At least a portion of the optical signal 230 incident on the first detector 244 may be reflected from the surface of the first detector 244 and is incident on the second detector 238, which, like the first detector 244, may be in communication with the interface coupling member 56 via at least one internal conduit 248 or communication device. As such, the second detector 238 coupled to the interface coupling member 56 may be in communication with one or more processors, networks, computers, or the like. Those skilled in the art will appreciate that any integrating sphere configuration, any number or variety of detectors, or any number or variety of optical elements may be used to measure the incident optical signal.

The embodiments disclosed herein are illustrative of the principles of the invention. Other modifications may be employed which are within the scope of the invention. Accordingly, the devices disclosed in the present application are not limited to that precisely as shown and described herein.

What is claimed is:

1. A method of manufacture of an optical characterization device, comprising:
   providing at least one housing with at least one system mount body positioned therein;
   positioning at least one first detector having a first wavelength responsivity range on the at least one system mount body;
   providing at least one second detector mount body coupled to the at least one system mount body;
   positioning at least one second detector having a second wavelength responsivity range that is substantially different from the first wavelength responsivity range on the at least one second detector mount body, the at least one second detector being in optical communication with the at least one first detector; and
   forming at least one beam dump region with at least one mount body wall within the system mount body, the at least one beam dump region formed in optical communication with at least one of the at least one first detector and the at least one second detector.

2. The method of claim 1, further comprising providing at least one additional detector having a third wavelength responsivity range positioned on the at least one system mount body or the at least one second detector body.

3. The method of claim 1, further comprising forming the at least one mount body wall with at least one arcuate shape configured to receive and retain optical radiation within the system mount body.

4. The method of claim 1, further comprising forming the at least one mount body wall with at least one arcuate shape of varying radius configured to receive and retain optical radiation within the system mount body.

5. The method of claim 1, further comprising forming the at least one mount body wall with at least one polygonal shape.

6. The method of claim 1, further comprising forming the at least one mount body wall with at least one polyhedral shape.

7. The method of claim 1, wherein at least one of the at least one beam dump region, the at least one second detector mount body, or the at least one system mount body acts as a heat sink.

8. The method of claim 1, further comprising forming at least one heat dissipating feature on at least one of the at least one mount body wall of the beam dump region, the at least one system mount body, or the at least one second detector mount body.

9. The method of claim 1, further comprising depositing at least one reflectivity enhancing material on the at least one mount body wall of the at least one beam dump region.

10. The method of claim 1, further comprising depositing at least one energy dissipating material on the at least one mount body wall, the at least one energy dissipating material configured to reduce or prevent unwanted reflected energy from propagating to the at least one first detector or the at least one second detector.

11. The method of claim 1, further comprising providing at least one processor device, the at least one processor device in communication with at least one of the at least one first detector or the at least one second detector via at least one conduit.

12. The method of claim 1, wherein the first detector has a wavelength responsivity range from about 800 nanometers to about 1800 nanometers and the second detector has a wavelength responsivity range from about 180 nanometers to about 1100 nanometers.

13. The method of claim 1, wherein the first detector is a Germanium-based detector.

14. The method of claim 1, wherein at least one of the first detector or the second detector is selected from the group consisting of Silicon (Si), Germanium (Ge), Indium Gallium Arsenide (In GaAs), Gallium Arsenide (GaAs), Lead (II) Sulfide (PbS), Mercury Cadmium Telluride (HgCdTe), Gallium Nitride (GaN), Gallium Phosphide (GaP) and Cadmium Zinc Telluride (CdZnTe).

15. A method of manufacture of an optical characterization device, comprising:
   providing at least one housing with at least one system mount body positioned therein;
   positioning at least one first detector having a wavelength responsivity range from about 800 nanometers to about 1800 nanometers on the at least one system mount body;
   providing at least one second detector mount body coupled to the at least one system mount body;
   positioning at least one second detector having a wavelength responsivity range from about 180 nanometers to about 1100 nanometers on the at least one second detector mount body, the at least one second detector being in optical communication with the at least one first detector; and
   forming at least one beam dump region with at least one mount body wall within the system mount body, the at least one beam dump region formed in optical communication with at least one of the at least one first detector and the at least one second detector.

16. The method of claim 15, wherein at least one of the first detector or the second detector is selected from the group consisting of Silicon (Si), Germanium (Ge), Indium Gallium Arsenide (In GaAs), Gallium Arsenide (GaAs), Lead (II) Sulfide (PbS), Mercury Cadmium Telluride (HgCdTe), Gallium Nitride (GaN), Gallium Phosphide (GaP) and Cadmium Zinc Telluride (CdZnTe).

* * * * *